(12) United States Patent
Terashima

(10) Patent No.: US 7,473,965 B2
(45) Date of Patent: Jan. 6, 2009

(54) STRUCTURE OF A HIGH BREAKDOWN VOLTAGE ELEMENT FOR USE IN HIGH POWER APPLICATIONS

(75) Inventor: Tomohide Terashima, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/747,550

(22) Filed: May 11, 2007

(65) Prior Publication Data

US 2008/0179663 A1    Jul. 31, 2008

(30) Foreign Application Priority Data

Jan. 29, 2007    (JP) .............................. 2007-017916

(51) Int. Cl.
*H01L 29/76*  (2006.01)
*H01L 29/94*  (2006.01)
*H01L 31/00*  (2006.01)

(52) U.S. Cl. ................... 257/336; 257/337; 257/339; 257/370; 257/401; 257/492; 257/493

(58) Field of Classification Search ............... 257/335, 257/337, 339, 370, 401, 492, 493, E27.015
See application file for complete search history.

(56) References Cited

U.S. PATENT DOCUMENTS

| 4,292,642 | A | 9/1981 | Appels et al. |
| 7,067,878 | B2 * | 6/2006 | Ohyanagi et al. ............ 257/336 |
| 7,148,540 | B2 * | 12/2006 | Shibib et al. ................. 257/336 |
| 7,221,036 | B1 * | 5/2007 | Vashchenko et al. ........ 257/565 |
| 7,238,986 | B2 * | 7/2007 | Pendharkar et al. .......... 257/336 |

FOREIGN PATENT DOCUMENTS

| JP | 2-185067 | 7/1990 |
| JP | 4-212464 | 8/1992 |
| JP | 11-68106 | 3/1999 |

OTHER PUBLICATIONS

U.S. Appl. No. 11/738,039, filed Apr. 20, 2007, Terashima, et al.
U.S. Appl. No. 11/747,550, filed May 11, 2007, Terashima.

* cited by examiner

*Primary Examiner*—Ngan Ngo
(74) *Attorney, Agent, or Firm*—Oblon, Spivak, McClelland, Maier & Neustadt, P.C.

(57) ABSTRACT

The relationship between a distance Ls between a base layer and an n type buffer layer formed on the surface of a drift layer and the thickness t of a semiconductor substrate in contact with the drift layer is set to $Ls \leqq t \leqq 2 \times Ls$. A loss upon turn-off of a high breakdown voltage semiconductor device can be reduced without deteriorating breakdown voltage characteristics.

6 Claims, 8 Drawing Sheets

: HIGH-CONCENTRATION p TYPE SUBSTRATE (DIFFUSION LAYER) MAY BE PROVIDED BETWEEN ELECTRODE 64 AND SUBSTRATE 60

SOLID LINE: t≈4Ls    DASHED LINE: t≈2Ls

: HIGH-CONCENTRATION p TYPE SUBSTRATE
(DIFFUSION LAYER) MAY BE PROVIDED BETWEEN
ELECTRODE 64 AND p TYPE SUBSTRATE 60

: HIGH-CONCENTRATION p TYPE SUBSTRATE
(DIFFUSION LAYER) MAY BE PROVIDED BETWEEN
ELECTRODE 64 AND p TYPE SUBSTRATE 60

US 7,473,965 B2

STRUCTURE OF A HIGH BREAKDOWN VOLTAGE ELEMENT FOR USE IN HIGH POWER APPLICATIONS

BACKGROUND OF THE INVENTION

1. Field of the Invention

The present invention relates to a semiconductor device, and particularly to a structure of a high breakdown voltage element for use in high power applications such as power devices.

2. Description of the Background Art

Power devices are widely used in home electric appliances and on-vehicle applications for driving and controlling of high power. The power devices include high-output power transistors which perform switching operations. The power transistors include power MOSFETs (insulated gate field effect transistors) and power bipolar transistors, and further IGBTs (insulated gate bipolar transistors) that are MOSFETs utilizing conductivity modulation. The IGBT has the characteristics that the input impedance is as high as the MOSFET and that the on-resistance can be reduced as in the bipolar transistor.

Device structures of the IGBT include a vertical structure and a lateral structure. In the IGBT having a vertical structure, an emitter electrode and a gate electrode are arranged opposing a collector electrode with respect to a substrate region of the device. In the IGBT having a lateral structure, an emitter electrode, a collector electrode and a gate electrode are placed on the same surface side of the device. Therefore, integration with other circuits such as a drive circuit is easy, and in recent years, IGBT having a lateral structure has been widely used in home electric appliances and on-vehicle applications.

Examples of the structure of the lateral IGBT are shown in Reference 1 (Japanese Patent Laying-Open No. 04-212464), Reference 2 (Japanese Patent Laying-Open No. 11-068106) and Reference 3 (Japanese Patent Laying-Open No. 02-185067).

In the configuration shown in Reference 1, an n-drift layer is formed in contact with the surface of a p- type substrate surface. The n- drift layer is an epitaxial layer. An n type buffer layer is formed on the surface of the n- drift layer. A p+ type collector region is formed, on the surface of the n type buffer layer, being surrounded by the buffer layer. In addition, on the surface of the n- drift layer, a p type base region is formed at a distance from the buffer layer. An n+ type emitter region is formed on the surface of the p type base region. The p type base region is coupled to the p- substrate by a high-impurity-concentration p+ type buried layer. The p+ type buried layer is formed to a depth deeper than the drift layer and extending into the p- substrate. The emitter electrode is provided so as to short-circuit the base region and the emitter region.

In the lateral IGBT shown in Reference 1, a first pnp bipolar transistor is formed by the p+ type collector region, the n buffer layer, the n- drift layer, the p- type substrate and the p+ type buried layer. In addition, a second pnp bipolar transistor is formed by the collector region, the n type buffer layer, the n- drift layer and the p type base region. The first and second pnp bipolar transistors are coupled in parallel.

In Reference 1, in the lateral IGBT structure, a rear side emitter electrode is formed on the rear surface of the p- substrate for the purpose of reducing a switching loss and preventing a latch-up phenomenon. The rear-side emitter electrode is short-circuited with an electrode formed on the emitter region. Due to the short circuit of the rear-side emitter electrode, a narrow base bipolar transistor is formed by the collector region, the buffer region, the n- drift layer and the p- substrate region. The on-voltage is lowered and the turn-off time is shortened taking advantage of a high current amplification factor of the narrow base bipolar transistor. In addition, the short circuit between the rear-side emitter electrode and the electrode on the emitter region, parallel operations of the first and second bipolar transistors are prevented. In this way, a hole current is divided into a lateral current and a vertical current, and the hole current is prevented from concentrating on the emitter region to inhibit the latch-up.

In the lateral IGBT shown in Reference 2 (Japanese Patent Laying-Open No. 11-068106), the p- substrate is connected to the back-surface electrode through a p+ diffusion layer doped at a high concentration. In Reference 2, by coupling the p- type substrate to the back surface electrode through the p+ diffusion layer, the lifetime of a charge carrier flowing through the p- type substrate is increased to increase the current load capability. Further, in Reference 2, as in Reference 1, the lateral current component is reduced to prevent the turn-on of a lateral parasitic thyristor to increase the latch-up immunity.

In addition, in Reference 2, the impurity concentration gradient of a p-/p+ junction region between the p- type substrate and the high-impurity-concentration p+ diffusion layer is decreased and the field intensity is locally reduced. In this way, an avalanche phenomenon resulting from a vertical current by holes is prevented from occurring.

Reference 2 also discloses a RESURF (Reduced Surface Field) structure for ensuring a high breakdown voltage. Reference 2 shows that if the RESURF region (drift layer) is formed with a diffusion layer, its doping concentration is desirable to be about $1E12/cm^2$ (^ represents a power). It is disclosed that under such condition, a positive voltage is applied to an anode terminal (collector terminal) to reversely bias a pn junction between the drift layer and the base region and a junction portion between the drift layer and the p- substrate, whereby a depletion layer spreads throughout the n- type drift layer. It is also disclosed for the function of the buffer layer that the impurity concentration of the buffer layer is made higher than that of the n- drift layer, whereby the depletion layer can spread from the RESURF region (n- drift layer) to the anode region (collector region) to prevent occurrence of punch-through.

In the IGBT shown in Reference 3 (Japanese Patent Laying-Open No. 02-185067), an insulating layer is provided on the surface of the p- type substrate (bottom of the drift layer) in the area under the p type anode region (collector region). No insulating layer is provided in the area under the base region, and the p type base region is coupled to the p type substrate though the n- drift layer.

In Reference 3, the holes injected from the anode region (collector region) upon turn on are conducted to the base region through the drift layer while preventing the shunting of holes to the substrate direction by the insulating film. In this way, a conductivity modulation effect is fully taken advantages of, the on-resistance is reduced to reduce the on-voltage.

Furthermore, since no insulating film is formed in the area under the base region, the holes are absorbed through the substrate region in the area under the base region. Thus, a situation in which the hole current transferred from the collector region entirely flows from the based region to the cathode region (emitter region) is prevented to prevent occurrence of latch-up.

Reference 4 (U.S. Pat. No. 4,292,642) discusses the relationship between the depth of the drift layer and the length of the drift layer, based on distributions of a horizontal field and a vertical field, for improving the breakdown voltage performance by the RESURF structure.

In Reference 4, a low-impurity-concentration drift region of a different conductivity type is formed in the area under a low-impurity-concentration (low-concentration hereinbelow) base region. At the outer periphery of the low-concentration base region and the substrate region, a high-impurity-concentration (high-concentration hereinbelow) isolation region is provided at a distance from the base region. Reference 4 shows that if the depletion layer is allowed to spread from the low-concentration base region and the high-concentration isolation region on the outer periphery thereof to a low-concentration drift region at the lower side to fully deplete the low-concentration drift region, the breakdown voltage of the element is determined by a horizontal pn junction between the low-concentration base region and the low-concentration drift layer. Particularly, Reference 4 shows that the breakdown voltage can be increased by lowering the impurity concentrations of the low-concentration base region and the low-concentration drift region. Specifically, Reference 4 shows that if the distance between the high-concentration isolation region at the surface and the high-concentration base region is increased and the thickness of the low-concentration base region and the impurity concentration are decreased, the maximum value of the field intensity at the PN junction at the inside becomes higher than the field intensity at the surface to cause an dielectric breakdown at the internal horizontal PN junction. Particularly, Reference 4 discloses that by making the filed intensity along the surface of the low-concentration base layer symmetric, the maximum field intensity at the surface can be decreased, and calculates the impurity concentration of each region for increasing the breakdown voltage by full depletion in the RESURF structure described above in accordance with a calculation expressions.

As described above, in the lateral IGBT, the RESURF structure is generally used for achieving a high breakdown voltage performance. When the IGBT having the RESURF structure is in an off state, a positive bias is applied to the collector electrode to set a PN junction between the n− type drift layer and the p− type substrate to a reverse bias state. Under this condition, the entire region of the n type drift layer is depleted. Ideally, as disclosed in Reference 4, the surface field of the n type drift layer is made constant.

In other words, the full depleting of the n− drift layer is based on the premise that the n− drift layer is entirely depleted while the pn junction just below the collector electrode does not enter an avalanche state. In addition, as described in FIG. 12 of Reference 4, when the n− drift layer is easy to be excessively depleted, the depletion layer spreads along the surface to arrive at the collector electrode before the depletion layer from the pn junction between the drift layer on the lower side and the substrate region spreads, so that the surface field at the collector electrode side increases to cause a reduction in breakdown voltage. Therefore, as described previously, there is an optimum value called a RESURF condition in the total amount of impurity per unit area of the drift layer. The RESURF condition is 1E12/cm^2.

On the other hand, the vertical field just below the collector electrode is roughly a rectangular field approximated by one-dimensional step junction. In this case, a breakdown voltage of a p+/n/n−/p− junction in the area under the collector electrode can be calculated in a manner as shown in Reference 4.

Conventionally, the thickness t of the p− substrate is set to about 400 μm. The thickness of the p− substrate, i.e. 400 μm, is sufficiently large as compared to spread of the depletion layer (about 100 μm) just below the collector electrode. In this way, the risk that the deleted layer arrives at the rear-side electrode (backside emitter electrode) formed on the back surface of the substrate to cause the punch-through, is avoided. Furthermore, the thickness, t, is set to such thickness, since production has generally been made based on the mechanical strength of a semiconductor device and the general thickness of a substrate of a general integrated circuit chip.

However, recent analyses by inventors have revealed that an optimum range exists for the thickness, t, of the p− type substrate layer for which only the vertical spread of the depletion layer has been considered, and if the thickness t lies within the optimum range, various problems occur in terms of electric characteristics.

Namely, when the lateral IGBT is in an on state, the conductivity modulation occurs between the emitter and the collector due to injection of minority carriers, and most of the current flows between the emitter electrode and the collector electrode. In this case, a part of the current flows from the collector region through the drift layer and the substrate region to the rear surface electrode. For the vertical bipolar transistor operation component flowing in the longitudinal direction, if the thickness, t, of the p− type substrate increases, an area injected with minority carriers is widened, and an area influenced by the conductivity modulation spreads in the direction of the thickness of the p− type substrate. In this case, however, due to the thickness, t, of the p− type substrate, the resistance of the substrate region increases and the vertical bipolar transistor operation component decreases. In this case, the on-current slightly decreases as the thickness, t, increases.

On the other hand, when the thickness t of the p− type substrate is excessively small, the current component flowing from the collector electrode to the rear surface electrode excessively increases. Therefore, the conductivity modulation by minority carriers from the collector electrode to the emitter electrode is hindered, and the on-current abruptly decreases.

Furthermore, in the process of turn-off of the lateral IGBT, the voltage of the gate electrode is set to 0 V, and an electronic current via a channel formed in the area under the gate electrode with the insulating film arranged in between disappears (the channel is no longer formed). Thereafter, a major part of current components becomes a hole current injected from the collector region. In this state, if the thickness, t, of the p− type substrate is large, as for the hole current, the current component flowing along the surface directly to the emitter electrode becomes dominant. In this case, the distance through which the hole current is long, the resistance value becomes high, the collector voltage increases due to a voltage drop, the turn-off time becomes long to increase the turn-off loss.

Further, the current flowing into the emitter electrode becomes dominant, and due to a voltage drop in the base region, the base to emitter is forwardly biased, and a latch-up phenomenon tends to occur due to transition from a parasitic bipolar transistor operation to a thyristor operation. Accordingly, a problem of decrease in maximum controllable current arises.

For the relationship between the breakdown voltage characteristics and the thickness of the substrate, a similar problem arises in a lateral diode. If the substrate is thick, a problem of an increased turn-off loss and a decreased on-current arises depending on the relationship between the depth of the depletion layer spreading just below the cathode region and the thickness of the substrate.

In Reference 1, the electrode formed on the rear surface of the substrate is short-circuited with the emitter electrode, whereby concentration of a current on the emitter electrode is avoided to inhibit occurrence of latch-up. However, although Reference 1 discloses an IGBT having the RESULF structure, it does not discuss the relationship between the thickness of the substrate region, and the turn-off loss and the breakdown voltage.

In Reference 2, a high-concentration diffusion region is formed through diffusion of impurities in a low-concentration p type epitaxial layer, and an impurity concentration gradient is provided in the substrate region. By this configuration, an avalanche breakdown is suppressed, and the carrier lifetime is lengthened to increase the current load capability. However, although Reference 2 discloses a RESURF condition, it does not discuss the relationship between the thickness of the substrate region, and the breakdown voltage and the turn-off loss.

In Reference 3, for inhibiting the latch-up, an insulating layer is provided in the area under the collector region, the longitudinal hole current may be inhibited from flowing in the neighborhood of the collector region, to aim improvement in efficiency of injection of minority carriers for enhancing the effect of the conductivity modulation. However, although Reference 3 discloses a horizontal distance between the p type anode region (collector region) and the p type base region and a length of a buried insulating film formed at the lower layer, it does not discuss the relationship between the thickness of the underlying substrate and the breakdown voltage or turn-off loss.

In the configuration shown in Reference 4, it is disclosed that the distance between the lateral high-concentration region (isolation region) and the base region is made longer than the length of the depletion layer spreading from the pn junction at the interface of the isolation region, and the thickness of the drift layer is discussed along with the impurity concentration of the layer. However, Reference 4 does not discuss the relationship between the thickness of the underlying p− type substrate region, and the turn-off loss and the breakdown voltage. Reference 4 merely describes that the maximum value of the vertical field intensity is made higher than the maximum value of the horizontal surface field.

SUMMARY OF THE INVENTION

It is an object of the present invention to provide a semiconductor device capable of reducing a turn-off loss and inhibiting latch-up while maintaining a breakdown voltage characteristic without increasing the number of manufacturing steps.

In the semiconductor device according to the present invention, in brief, the relationship between the length, L, of a low-concentration drift layer between impurity regions placed at a distance from each other on the surface of the low-concentration drift layer along the surface and the thickness, t, of a substrate region in the area under the drift layer is set to $L \leq t \leq 2 \times L$.

Specifically, the semiconductor device according to the first aspect of the present invention includes a first semiconductor substrate of a first conductivity type, a first semiconductor region of the first conductivity type formed on a first main surface of the first semiconductor substrate, a second semiconductor region of the first conductivity type formed at a distance from the first semiconductor region on the first main surface of the first semiconductor substrate, a third semiconductor region of a second conductivity type formed at least on a region between the first semiconductor region and the second semiconductor region on the first main surface side of the first semiconductor substrate, a fourth semiconductor region of the second electric conductivity type formed within the second semiconductor region on the surface of the second semiconductor region, and a fifth semiconductor region of the second conductivity type formed in contact with the first semiconductor substrate, to a depth deeper than the depths of the first, second and third semiconductor regions and surrounding the second and third semiconductor regions and formed, in contact with at least a part of the second semiconductor region, encompassing the second semiconductor region.

The semiconductor device according to the first aspect further includes a first electrode electrically connected to the first semiconductor region, a second electrode electrically connected to the second and fourth semiconductor regions, a conductive layer formed on the second semiconductor region between the fourth semiconductor region and the fifth semiconductor region with an insulating film interposed between the conductive layer and the second semiconductor region, and a fourth electrode electrically coupled to the first semiconductor substrate.

The distance, t, from a junction interface between the fifth semiconductor region just below the third semiconductor region and the first semiconductor substrate to the second main surface of the first semiconductor substrate and the distance L between the second and third semiconductor regions satisfies the relationship of $L \leq t \leq 2 \times L$.

The semiconductor device according to the second aspect of the present invention includes a first semiconductor substrate of a first conductivity type, a first semiconductor region of a second conductivity type formed on a first main surface of the first semiconductor substrate, a second semiconductor region of the first conductivity type formed at a distance from the first semiconductor region on the first main surface of the first semiconductor substrate, and a third semiconductor region of the second conductivity formed in contact with the first semiconductor substrate, to a depth greater than the depth of the first semiconductor region and surrounding the first semiconductor region and being formed in contact with at least part of the second semiconductor region and encompassing the second semiconductor region, a first electrode electrically connected to the first semiconductor region.

The semiconductor device according to the second aspect further includes a second electrode electrically connected to the second semiconductor region, and a third electrode electrically coupled to the first semiconductor substrate through the second main surface of the first semiconductor substrate.

The distance t from a junction interface between the third semiconductor region just below the first semiconductor region and the first semiconductor substrate to the second main surface of the first semiconductor substrate and the distance L between the first and second semiconductor regions satisfies the relationship of $L \leq t \leq 2 \times L$.

When the thickness of the drift layer decreases by a factor of 2 if the RESURF condition is satisfied, the impurity concentration of the layer is required to increase by a factor of 2. For a condition in which the length of the depletion layer is greatest in the vertical direction, it is required to consider the length (depth) of the depletion layer penetrating the first semiconductor substrate. If the impurity concentration of the first semiconductor substrate is reduced, the spread of the depleted layer from the first semiconductor region can be inhibited. However, if the impurity concentration of the semiconductor substrate is reduced, an additional production process for adjusting the impurity concentration is required, thus increasing the cost of the substrate. Therefore, the impurity concentration of the semiconductor substrate is increased as much as possible and the thickness of the semiconductor substrate is reduced to improve an element characteristic.

If the length L along the direction of the surface of the fifth semiconductor region among semiconductor regions through which the aforementioned depletion layer spreads in the horizontal direction is set to 1 to 2 times as great as the thickness t of the semiconductor substrate, by reducing the thickness of the semiconductor substrate, a hole current upon turn-off can be reduced by a back-surface electrode, thus making it possible to reduce a turn-off loss. In addition, the hole current flowing along the direction of the surface can be reduced upon turn-off, thus making it possible to reduce latch-up. Furthermore, due to the RESURF structure, a dielectric breakdown voltage can be set according to the vertical field intensity, thus making it possible to inhibit a reduction in breakdown voltage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
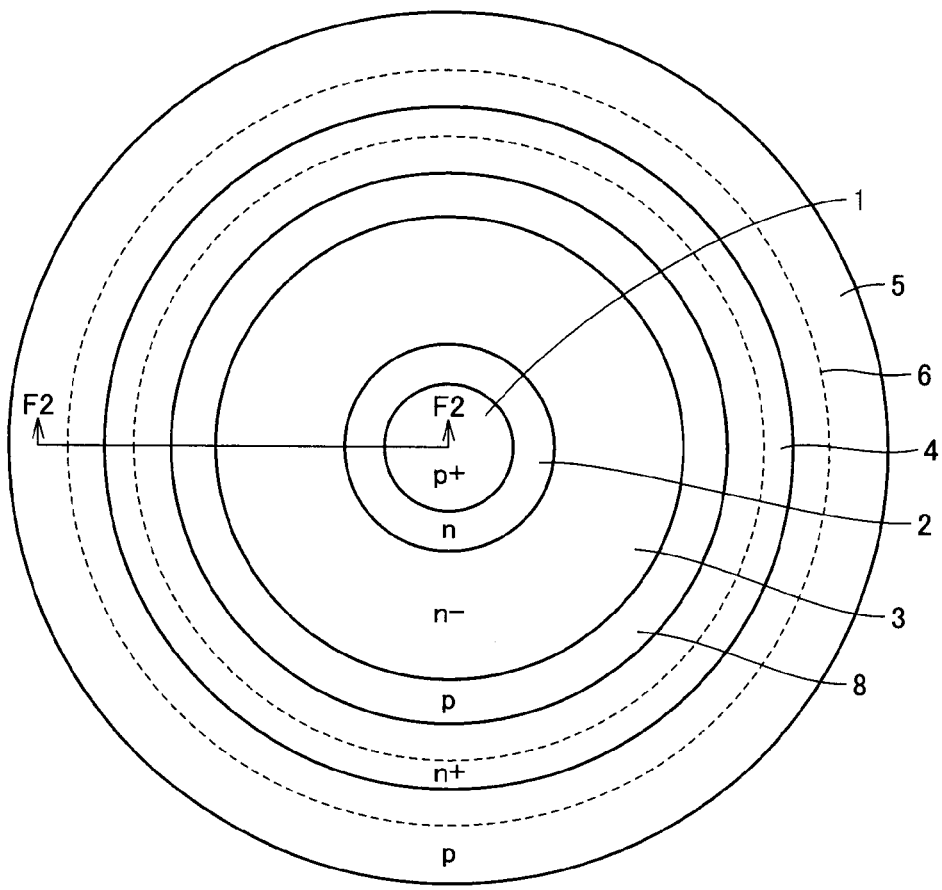
FIG. 1 schematically shows a planar layout of a semiconductor device according to embodiment 1 of the present invention.

FIG. 1 schematically shows a planar layout of a semiconductor device according to embodiment 1 of the present invention. In FIG. 1, the arrangement of impurity regions is shown, and no electrode is shown for the sake of simplification of the drawing.

In FIG. 1, there is provided a p type (first conductivity type) collector layer (first semiconductor region) 1 formed at the center, and an n type (second conductivity type) buffer layer (third semiconductor region) 2 formed encompassing collector layer 1. In FIG. 1, n type buffer layer 2 is formed in a ring form so as to surround p type collector layer 1 in the planar layout.

Outside n type buffer layer 2, a low-concentration n type drift layer (fifth semiconductor region) 3 is formed in contact with n type buffer layer 2. In this planar layout, n type drift layer 3 is shown being formed in a ring form, but it is formed over the entire area in the semiconductor device.

Outside n type drift layer 3, a p type base layer (second semiconductor region) 5 is formed surrounding p type collector layer 1 and n type buffer layer 2. An n type emitter layer (fourth semiconductor region) 4 is formed in p type base layer 5. Between n type emitter layer 4 and n type drift layer 3, a channel forming region 8 is placed, on which an inversion layer is formed by a gate electrode (conductive layer) (not shown). A contact region 6 on which an emitter electrode (second electrode) is placed is provided contacting both n type emitter layer 4 and p type base layer 5. By short-circuiting both the base layer and the emitter layer with the electrode arranged on the contact region 6, a thyristor operation is prevented. N type buffer layer 2 formed on the outer periphery of p type collector layer 1 absorbs minority carriers ejected from p type collector layer 1 and prevents a depletion layer from arriving at collector layer 1 to cause punch-though.

Channel forming region 8 is formed at a distance from collector layer 1 and surrounding collector layer 1, and a sufficient channel width is secured to drive a large current.

The semiconductor device shown in FIG. 1 is a lateral IGBT. A plurality of cells are provided with the semiconductor device of FIG. 1 being a cell, and these cells are operated in parallel to achieve a high breakdown voltage power device which controls a large power.

In FIG. 1, the semiconductor device is formed in a circular form. However, the semiconductor device may be formed into a track form having linear sections and arc sections like a track in an athletic field.

Figure 2:
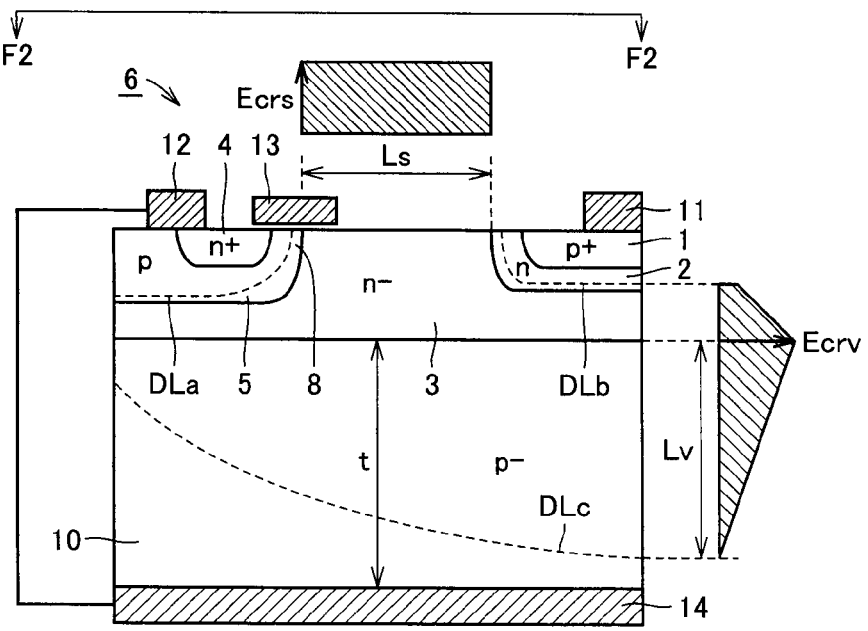
FIG. 2 schematically shows the sectional structure taken along line F2-F2 shown in FIG. 1.

FIG. 2 schematically shows a sectional structure taken along line F2-F2 shown in FIG. 1. In FIG. 2, n type drift layer 3 is formed on a first main surface of a p type semiconductor substrate (first semiconductor substrate) 10. N type buffer layer 2 is formed on the surface of n type drift layer 3. N type buffer layer 2 has a well structure, and its depth is less than that of n type drift layer 3. On the surface of n type buffer layer 2, high-concentration p type collector layer 1 is formed so as to be surrounded by n type buffer layer 2. A collector electrode (first electrode) 11 is formed (electrically connected) in contact with the surface of p+ type collector layer 1.

Furthermore, p type base layer 5 is formed by a p type well on the surface of n type drift layer 3. On the surface of p type base layer 5, n type emitter layer 4 is formed being surrounded by base layer 5. An emitter electrode (second electrode) 12 is formed (electrically connected) in contact with both p type base layer 5 and n type emitter layer. Emitter electrode 12 is formed in contact region 6 shown in FIG. 1, and electrically short-circuits emitter layer 4 and p type base layer 5.

A gate electrode (conductive layer) 13 is formed on the surface of p type base layer 5 between n type emitter layer 4 and n type drift layer 3 with a gate insulating film (not shown) interposed between gate electrode 13 and the surface of p type base layer 5. Channel forming region 8 is arranged on the surface of p type base layer 5 just below gate electrode 13.

A rear-side electrode 14 is provided in contact with (electrically connected) the back surface (second main surface) of p type semiconductor substrate 10. Rear-side electrode 14 is normally electrically short-circuited with emitter electrode 12.

In the semiconductor device shown in FIG. 2, a positive voltage is applied to gate electrode 13 with the voltage of emitter electrode 12 being a reference voltage upon turn-on operation. By application of a positive bias voltage to gate electrode 13, an inversion layer is formed in channel forming region 8, and n type emitter layer 4 and n type drift layer 3 are electrically connected. Accordingly, an electron current flows from n type emitter layer 4 to n type drift layer 3. If the electron current arrives at n type buffer layer 2 and is accumulated, a pn junction between n type collector layer 1 and n type buffer layer 2 becomes conductive, and a hole current flows into n type drift layer 3 from p type collector layer 1. Due to the hole current, the conductivity modulation occurs in n type drift layer 3, the channel resistance decreases, and a larger amount of electron current flows.

Upon turn-on, a vertical pnp bipolar transistor is formed by p type collector layer 1, n type buffer layer 2, n type drift layer 3 and p type substrate 10, and holes injected from collector layer 1 are in part ejected through p type semiconductor substrate 10 and rear-side electrode 14. Accordingly, the amount of hole current injected into base layer 5 is reduced, the pn junction at p type base layer 5 and n type emitter layer 4 is prevented from becoming conductive, and accordingly, a situation is prevented in which a large amount of electron current flows from n type emitter layer 4 to p type base layer 5 to cause the latch-up.

Upon turn-off operation, 0 V is applied to gate electrode 13 to vanish the inversion layer in channel forming region 8 to cut off the path of the electron current. Upon the turn-off, the hole current accumulated in n type drift layer 3 and p type semiconductor substrate 10 is ejected, and thereafter, the semiconductor device turns into an off-state.

In the semiconductor device, or the lateral IGBT, a RESURF structure is applied for achieving a high breakdown voltage. In the RESURF structure, n type drift layer 3 is fully depleted in the off-state. When the semiconductor device is in the off-state, a positive bias voltage is applied to collector electrode 11. In an ideal state, if n type drift layer 3 is fully depleted, the surface field of n type drift layer becomes a constant field Ecrs.

The depletion layer also extends in p type semiconductor substrate 10 as shown with a depletion layer end DLa in p type base layer 5, a depletion layer end DBb in n type buffer layer 2 and a depletion layer end DLc in p type substrate 10. In p type semiconductor substrate 10, depletion layer end DLc is deeper in the area under collector layer 1 and becomes less deep as approaching the area under p type base layer 5. Generally, the thickness, t, of p type semiconductor substrate 10 is made larger than the depth Lv of depletion layer DLc in p type semiconductor substrate 10 for preventing occurrence of punch-through.

N type drift layer 3 and p type semiconductor substrate 10 are in a reverse bias state, and the vertical field is highest (shown by field Ecrv in FIG. 2) at a pn junction interface between n type drift layer 3 and p type semiconductor substrate 10. In FIG. 2, it is assumed that the pn junction between p type drift layer 3 and p type semiconductor substrate 10 is a one-dimensional step junction, and in this assumption, the vertical field is a triangular form field.

Figure 3:
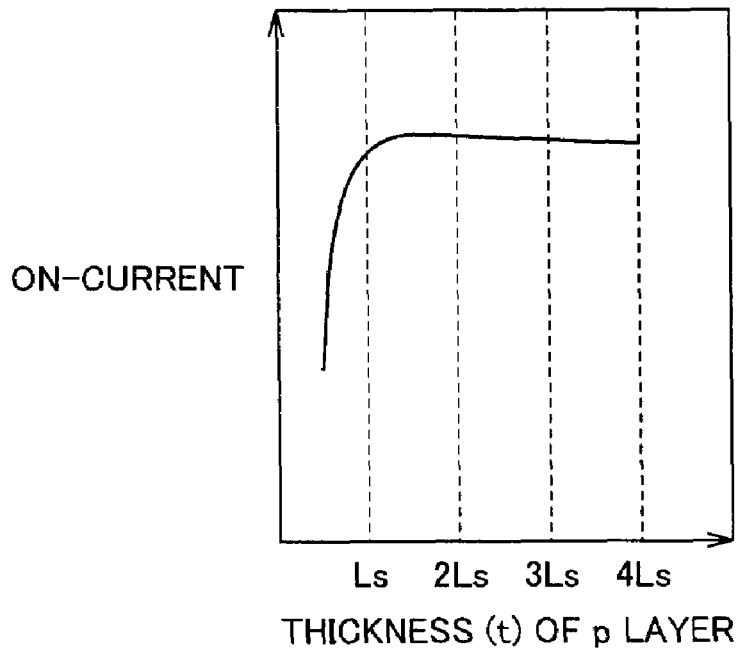
FIG. 3 shows the relationship between an on-current and the thickness of a substrate in the semiconductor shown in FIGS. 1 and 2.

FIG. 3 shows the relationship between the thickness, t, of p type semiconductor substrate 10 and an on-current flowing when in conduction. In FIG. 3, the substrate thickness, t, is shown on abscissa and the on-current is shown on the ordinate. Ls represents a distance along the surface of the drift layer between p type base layer 5 and n type buffer layer 2. Here, the thickness, t, represents a distance from the junction (first main surface) between drift layer 3 just below the buffer layer of the p type semiconductor substrate and substrate 10 to the second main surface (rear-side electrode) of the substrate. The same will apply hereinbelow.

As described above, when the thickness, t, of p type semiconductor substrate 10 is increased, a region through which the hole current flows from p type collector layer 1 becomes larger, a region in which the conductivity modulation occurs spreads along the thickness direction, and a region through which the electron current flows becomes larger. On the other hand, in this case, the resistance value of p type semiconductor substrate 10 is increased, and an operation component of a vertical pnp bipolar transistor formed by p type collector layer 1, n type buffer layer 2, n type drift layer 3 and p type semiconductor substrate 10 decreases. Thus, as shown in FIG. 3, the on-current gradually decreases when the thickness, t, of p type semiconductor substrate 10 is increased.

On the other hand, when the thickness, t, is too small, a current component flowing to rear-side electrode 14 excessively increases, the conductivity modulation is hindered, and the on-current abruptly decreases. For the thickness, t, of p type semiconductor substrate 10, it is required to satisfy a condition in which depletion layer end DLc does not arrive at rear-side electrode 14. The relationship between the distance Ls between p type base layer 5 and n type buffer layer 2 and the depth Lv of the depletion layer in p type semiconductor substrate 10, or the distance from the pn junction interface between n type drift layer 3 and p type semiconductor substrate 10 to depletion layer end DLc will be discussed below.

Assume that the RESURF condition is satisfied for a certain breakdown voltage requirement. In this case, when the thickness of n type drift layer 3 decreases down to half times, then the impurity concentration of the drift layer is doubled (under the RESURF condition, the total amount of impurity in the direction of the thickness of the drift layer is constant). Therefore, for a condition for increasing the depth of the depletion layer, it is sufficient to consider only the length Lv of the depletion layer extending toward the p type semiconductor substrate 10 side. If the impurity concentration of p type semiconductor substrate 10 is reduced, the effect of promoting the spread of the depletion layer from p type base layer (diffusion region) 5 to n− drift layer 3 declines. However, for the breakdown voltage in the longitudinal direction, no particular problem arises in the lateral IGBT, and therefore in a sense, the length Lv can be increased independently of the length Ls. However, if the impurity concentration of p type semiconductor substrate 10 is reduced, the cost for the substrate increases. Furthermore, since as described later, various problems arise in terms of element operations when the substrate thickness, t, is increased, it is assumed that the impurity concentration of p type semiconductor substrate 10 is increased to decrease the penetration depth of the depletion layer for reducing the penetration depth Lv.

It is assumed that as shown in FIG. 2, the maximum field Ecrs on the surface side is constant at a given voltage, the maximum vertical field Ecrv is equal to the maximum field Ecrs on the surface side, and the electric field is of a right angle form. In this case, the applied voltage is represented by a product of the field E and the length L, and thus the following equation holds.

$$Ecrs \times Ls = Ecrv \times Lv/2,$$

$$\therefore Lv = 2 \times Ls \quad (1)$$

From equation (1), it is apparent that it is not required to set the thickness, t, of p type semiconductor substrate 10 to 2×Ls or greater.

Now, a case will be considered where the avalanche condition is attained simultaneously at the surface side junction interface and the junction interface in the vertical direction.

The avalanche condition is known to be satisfactorily approximated by the integration of the field E raised to the seventh power as shown in equation (2).

$$\int A \times E(x)^7 dx = 1 \quad (2),$$

$$A = 1.8E - 35$$

In equation (2), the electric field E(x) assumes the constant value Ecrs and integration range is a range of 0 to Ls for the surface side. For the vertical electric field, integration is taken over a range of 0 to Lv as a range of x for an electric field represented by a right triangle having a gradient (Ecrv/Lv).

As a result, the following relational expressions are obtained for each of fields Ecrs and Ecrv and lengths Lv and Ls.

$$Ecrs < Ecrv,$$

$$Lv/Ls = 2^{(2/3)} \approx 1.6$$

Actually, the surface side electric field Es does not assume a constant value Ecrs due to influences by diffusion on the surface side and other factors. Therefore, when equation (2) is applied to the surface side electric field Es in a practical device, the shape of the electric field E(x) is close to the shape of the triangular shaped electric field. In this case, the length Ls becomes longer than a theoretical length, and in the worst case, Lv/Ls becomes equal to 1.

Therefore, in a practical device, the thickness, t, of p type semiconductor substrate 10 can be set in the range of Ls≦t≦2×Ls, according to the extension of the depletion layer of an individual element. Now, improvement of various electric characteristics of the lateral IGBT through control of the thickness, t, of the p type semiconductor substrate in the range described above will be discussed.

As described above with reference to FIG. 3, for the lateral IGBT, the on-current slightly decreases in total due to an increase in horizontal current and a decrease of the vertical current when the thickness, t, of p type semiconductor substrate 10 increases. If the thickness, t, decreases, the current component by the vertical bipolar transistor increases, the conductivity modulation is hindered, and the on-current abruptly decreases. When as shown in FIG. 3, the thickness t of p type semiconductor substrate 10 is set in a range of Ls or greater and 2×Ls or smaller, a region in which the on-current is largest can be included, and thus, a large on-current can be passed.

Figure 4:
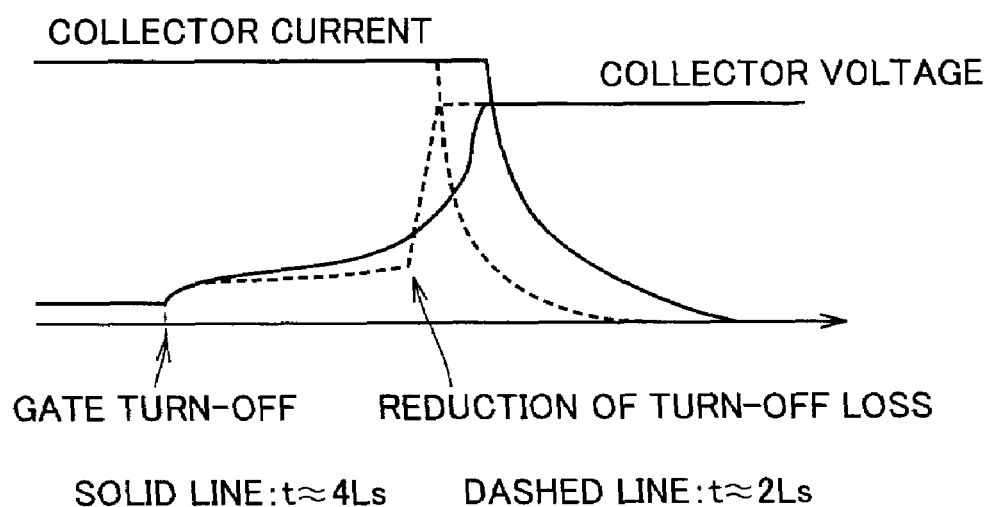
FIG. 4 shows the relationship between a collector voltage/current and the thickness of the substrate in the semiconductor device according to embodiment 1 of the present invention.

FIG. 4 shows the dependency of the collector current and the collector voltage of the lateral IGBT upon turn-off in the thickness, t, of semiconductor substrate 10. Abscissa represents time and the ordinate represents the current value/voltage value. The waveform of the dashed line represents an operating waveform when the thickness t is 2×Ls, and the solid line represents an operating waveform when the thickness t is 4×Ls. The load is an inductive load (L load). With reference to FIG. 4, the relationship between the element characteristic and the thickness upon turn-off will be described below.

In the process of turn-off of the lateral IGBT, after the voltage of gate electrode 13 is 0 V (gate turn-off) and the electron current from the channel in channel forming region 8 is cut off, a major part of current components is a hole current flowing from collector layer 1. If the thickness, t, increases, in such hole current, the component flowing to emitter electrode 12 becomes dominant, and the hole current flowing along the vertical direction toward rear-side electrode 14 is reduced. In this state, the length of n type drift layer 3 is longer than the length (depth) of n type drift layer 3 just below collector layer 1, and therefore the resistance value is high, and due to the voltage drop thereacross, the voltage of collector layer 1 increases as shown by the solid line in FIG. 4, and the collector current flows for a longer period of time, and the turn-off loss increases.

Namely, as shown in FIG. 4, the collector voltage starts to increase at the time of gate turn-off for cutting off the supply of a voltage to gate electrode 13. In the device of the thickness 4×L, the collector voltage increases to eject the ejection of hole current more slowly as compared with the device of the thickness t of 2×Ls. Therefore, if the thickness t is large (=4×Ls), the collector voltage gently rises, and ultimately reaches a bias voltage in turn-off, to cut off the collector current.

On the other hand, if the thickness, t, is as small as 2×Ls, the hole current ejected from the collector layer to rear-side electrode 14 increases, and the rise of the collector voltage is suppressed. Accordingly, the collector voltage steeply rises to a predetermined bias voltage, and the collector current is cut off at a faster timing. Specifically, if the thickness, t, is small as in the case of 2×Ls, the turn-off loss decreases down to the order of 60% to 70%. Here, the thickness, t, of 4×Ls corresponds roughly to the thickness (400 μm) of a conventional semiconductor device. By decreasing the thickness t, the turn-off loss can be reduced. Furthermore, the reduction of the turn-off loss has been confirmed in the actual measurement.

Furthermore, if the substrate thickness, t, is small, the hole current flowing into emitter electrode 12 through the base layer is reduced (due to the presence of the vertical current component), and the limit of transition from a parasitic npn transistor operation to a thrystor operation is increased to enhance the latch-up immunity. The limit of transition into the thyristor operation, or criticality for the occurrence of the latch-up, signifies the limit beyond which due to a voltage drop in p type base layer 5, an electron barrier between n type emitter layer 4 and p type base layer 5 disappears to allow the electron current to flow to the emitter electrode through the emitter layer. When the thyristor operation is carried out, the current cannot be limited even if the voltage of the gate electrode is set to 0 V, and a large current continuously flows to the emitter electrode. Thus, the maximum controllable current can be increased, and this effect has also been confirmed in an actual measurement.

[Modification 1]

Figure 5:
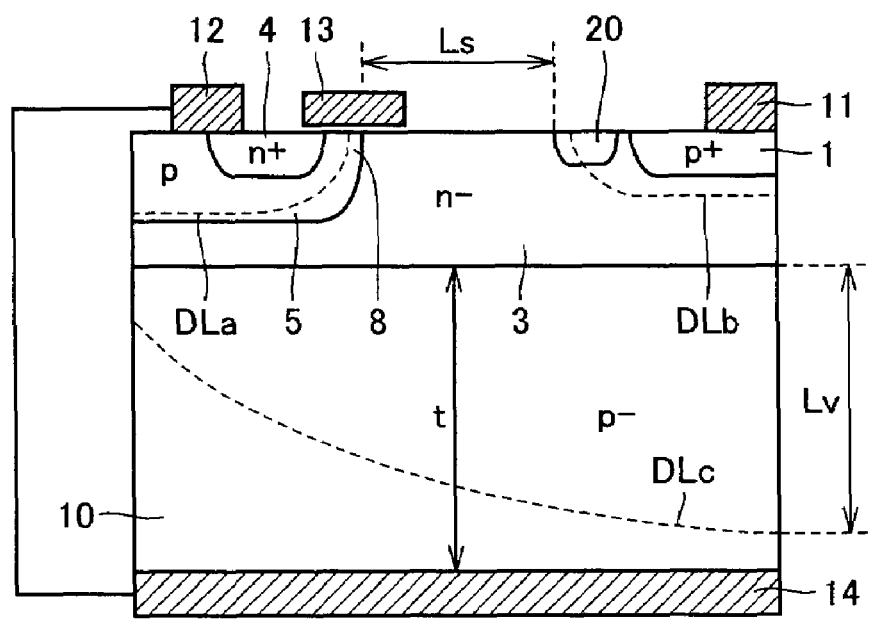
FIG. 5 schematically shows the sectional structure of the semiconductor device according to modification 1 of embodiment 1 of the present invention.

FIG. 5 schematically shows a sectional structure of the semiconductor device according to modification 1 of embodiment 1 of the present invention. The semiconductor device shown in FIG. 5 is different in the structure from the semiconductor device shown in FIG. 2 in the following points. Specifically, in place of n type buffer layer 2 shown in FIG. 2, an n type buffer layer (third semiconductor region) 20 is provided between p type collector layer 1 and p type base layer 5 and close to p type collector layer 1. The other configuration of the semiconductor device shown in FIG. 5 is the same as the configuration of the semiconductor device shown in FIG. 2, corresponding portions are assigned the same reference numerals, and detailed descriptions thereof will not be repeated.

In the semiconductor device shown in FIG. 5, the thickness t of p type semiconductor substrate 10 just below p type collector layer 1 and the distance Ls between p type base layer 5 and n type buffer layer 20 satisfy the relationship of $Ls \leq t \leq 2 \times Ls$.

N type buffer layer 2 shown in FIG. 2 is provided for avoiding a situation in which the depletion layer arrives at p type collector layer 1 to cause punch-through between n type drift layer 3 and p type collector layer and for absorbing holes (minority carriers) at the time of turn-off. When the depletion layer from p type semiconductor substrate 10 does not arrive at p type collector layer 1 and an end portion DLb of the depletion layer exists in an area under p type collector layer 1, n type impurity region (diffusion region) 20 can be used as a buffer layer. In other words, with n type impurity region (diffusion region) 20, the depletion layer from p type base layer 5 can be prevented from arriving at p type collector layer 1. Furthermore, at the time of turn-off, holes from collector layer 1 can be absorbed by impurity region 20, and a hole current can be ejected because of the small thickness of the substrate. Therefore, with the configuration of the semiconductor device shown in FIG. 5, same effect as that of the structure of the semiconductor device shown in FIG. 2 can be achieved.

N type impurity region (diffusion region) 20 of the semiconductor device shown in FIG. 5 is sufficient to be formed, through impurity injection, in a ring form surrounding p type collector layer 1 in the planar layout shown in FIG. 1.

[Modification 2]

Figure 6:
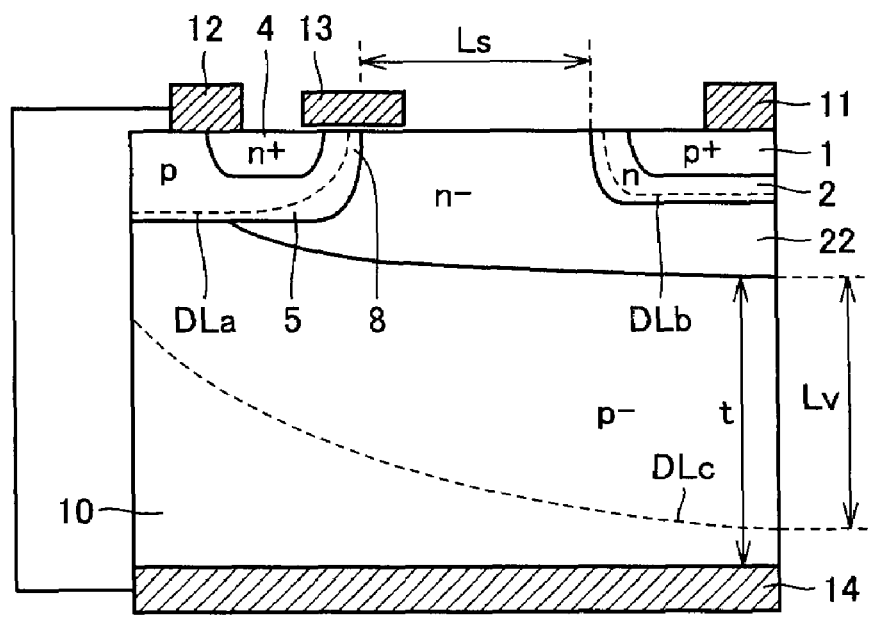
FIG. 6 schematically shows the sectional structure of the semiconductor device according to modification 2 of embodiment 1 of the present invention.

FIG. 6 schematically shows the configuration of modification 2 of embodiment 1 of the present invention. The semiconductor device shown in FIG. 6 is different in structure from the semiconductor device shown in FIG. 2 in the following point. Specifically, through deep diffusion of an n type impurity into p type semiconductor substrate 10, an n type diffusion layer (fifth semiconductor region) is formed on the surface of p type semiconductor substrate 10. N type diffusion layer 22 is formed to a depth deeper than the depth of n type buffer layer 2 and surrounding buffer layer 2. N type diffusion layer 22 is formed such that one end thereof extends to a portion of p type base layer 5 just below n type emitter layer 4. It is ensured that the hole current passed into n type diffusion layer 22 is reliably injected into p type base layer 5 from p type collector layer 1. A part of a first main surface of p type semiconductor substrate 10 contacts the bottom of the p type base layer 5. In other words, p type diffusion layer 22 is formed encompassing p type base layer 5. The thickness, t, of p type semiconductor substrate region 10 just below p type collector region 1 satisfies the aforementioned requirement of $Ls \leq t \leq 2 \times Ls$.

For other configuration of the semiconductor device shown in FIG. 6, it is same in the sectional structure as the semiconductor device shown in FIG. 2, corresponding parts are allotted the same reference numerals, and detailed descriptions thereof will not be repeated. In the semiconductor device shown in FIG. 6, impurity diffusion layer 22 formed of for example, an epitaxially grown film is provided in place of n type drift layer 3. Therefore, the semiconductor device shown in FIG. 6 can achieve the effect same as that of the semiconductor device shown in FIG. 2. When drift layer 3 is formed of a diffusion layer, it is required to completely form a depletion layer between base layer 5 and buffer layer 2. Therefore, even if the thickness of the drift layer decreases in this region, or the thickness of drift layer 3 decreases near the base layer, no particular problem arises because the depletion layer in this region is narrower as compared with the depletion layer just below the collector region.

When n type drift layer 3 is formed by an epitaxial layer, its thickness can accurately be controlled, and accordingly, the aforementioned relationship can accurately be satisfied, thus making it possible to reduce a turn-off loss. However, when the drift layer is formed by a diffusion layer, the manufacturing cost can be reduced as compared to a case where the epitaxial layer is formed.

In this connection, in the semiconductor device shown in FIG. 6, in place of n type buffer layer 2, n type diffusion layer 20 may be provided in close proximity to p type collector layer 1 on the surface of n type diffusion layer 22 as in modified example 1 shown in FIG. 5.

As described above, according to embodiment 1 of the present invention, the thickness, just below the collector region, of the p substrate region formed between the rear-side electrode and the n type drift layer is set to a value in a range of Ls or longer and 2×Ls or shorter with Ls representing the distance between the base layer and the buffer layer in the lateral IGBT. Therefore, the turn-off loss can be reduced and the maximum controllable current can be increased, making it possible to achieve a lateral IGBT excellent in latch-up immunity and breakdown voltage.

Embodiment 2

Figure 7:
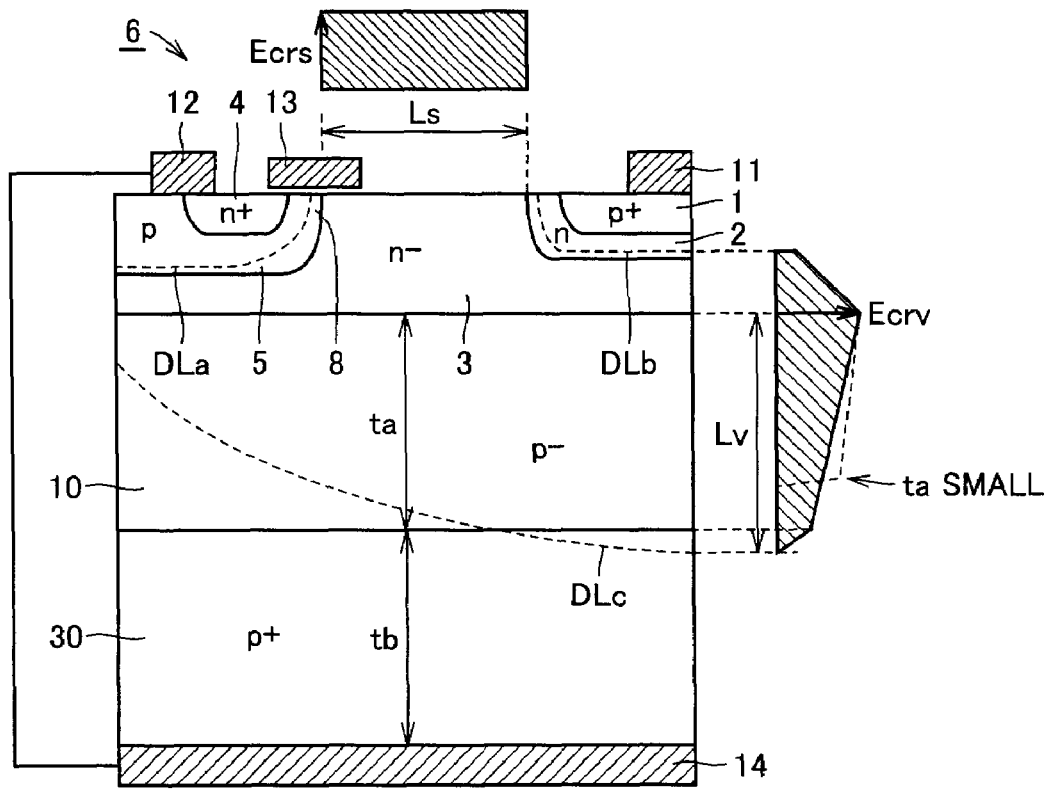
FIG. 7 schematically shows the sectional structure of the semiconductor device according to embodiment 2 of the present invention.

FIG. 7 schematically shows a sectional structure of the semiconductor device according to embodiment 2 of the present invention. The semiconductor device shown in FIG. 7 is different in structure from the semiconductor device shown in FIG. 2 in the following point. Specifically, a high-concentration p type semiconductor substrate (second semiconductor substrate) 30 is provided between p type semiconductor substrate 1 and rear-side electrode 14. The other configuration of the semiconductor device shown in FIG. 7 is same as the configuration of the semiconductor device shown in shown in FIG. 2, corresponding parts are allotted the same reference numerals, and detailed descriptions thereof will not be repeated.

In the semiconductor device shown in FIG. 7, the thickness ta of p type semiconductor substrate 10 is set to a value in a range of Ls or longer and 2×Ls or shorter. Ls represents a distance along the surface of drift layer 3 between p type base layer 5 and n type buffer layer 2.

The vertical electric field continuously decreases as approaching from the junction interface between n type drift layer 3 and p type semiconductor substrate 10 toward the p−/p+ junction between p− type semiconductor substrate 10 and p+ type semiconductor substrate 30. In high-concentration p type semiconductor substrate 30, the depletion layer is inhibited from spreading. Therefore, even if the depletion layer end DLc arrives at high-concentration p type semiconductor substrate 30, the vertical electric field abruptly decreases. Thus, the vertical electric field is of a trapezoidal form as shown in FIG. 7. A potential difference applied across the junction interface between p type semiconductor substrate and n type drift layer 2 and across the junction interface between p type semiconductor substrate 10 and high-concentration p type semiconductor substrate 30 is small as compared to the case of embodiment 1, and because of the low resistance of p+ substrate 30, the voltage drop across p type semiconductor substrate 30 is small. Therefore, the breakdown voltage in semiconductor substrates 10 and 30 can be maintained as in embodiment 1.

In addition, since high-concentration p type semiconductor substrate 30 is provided in contact with rear-side electrode 14, electrical connection to rear-side electrode 14 can be established with a low resistance. Thus, a vertical hole current flowing to high-concentration semiconductor substrate 30 through p type semiconductor substrate 10 upon turn-on and turn-off can be passed to rear-side electrode 14 efficiently, making it possible to improve a switching characteristic.

Furthermore, the depletion layer can be absorbed by p type semiconductor substrate 30, and the thickness, ta, of p type semiconductor substrate 10 can be made smaller than the thickness, t, shown in embodiment 1. Thus, the turn-off loss can be further reduced (refer to the dashed line waveform in FIG. 4).

High-concentration p type semiconductor substrate 30 is formed by diffusing an impurity from the back surface to p type semiconductor substrate 10 formed of a low-concentration epitaxial layer. In this case, the manufacturing cost can be reduced as compared to a case where both p type semiconductor substrate 10 and high-concentration p type semiconductor substrate 30 are epitaxially grown. In addition, if p type semiconductor substrate 30 is formed through impurity diffusion, the lifetime of charge carriers (holes) in p type semiconductor substrate 30 can be increased because an impurity concentration distribution is produced. Furthermore, due to impurity diffusion, the impurity concentration gently changes in the junction between substrates 10 and 30 (compared to the epitaxial growth film), and therefore an avalanche breakdown can reliably be prevented and a current driving power can be further improved. Thus, the stability of element characteristics can be improved.

Further, by forming the substrate region into a two-layer structure of p type semiconductor substrate 10 and high-concentration p type semiconductor substrate 30, the following effect is achieved. Specifically, by adjusting the thickness, tb, of p type semiconductor substrate 30, the substrate thickness (ta+tb) of the semiconductor device can be set to the thickness of a chip used in a general IC. Thus, a technical problem of thinly polishing a semiconductor wafer forming the semiconductor device, a problem concerning a substrate strength in assembly of the semiconductor device, and others can be avoided.

Meanwhile, in FIG. 7, the dashed line waveform of the vertical electrical fields represents a distribution of electrical fields when the thickness, ta, of p type semiconductor substrate 10 is further reduced.

As described above, according to embodiment 2 of the present invention, the stability of element characteristics can be improved and the turn-off loss can be further reduced, since the substrate region has a two-layer structure of p type low-concentration substrate 10 and p-type high-concentration substrate 30.

Here, in the configuration shown in FIG. 7, the n type drift layer may be formed by a diffusion layer as in the configuration shown in FIG. 6, and the configuration may be used in combination of the configuration of another modifications of embodiment 1.

Embodiment 3

Figure 8:
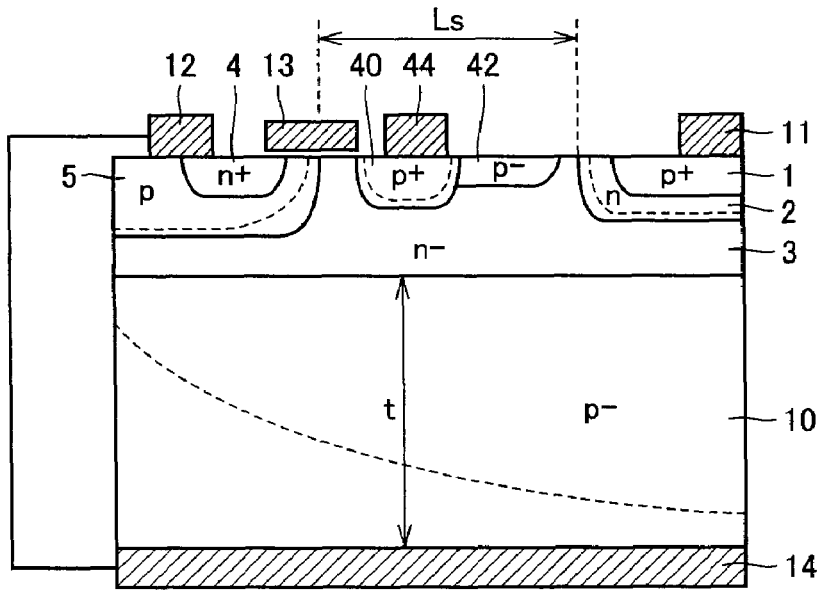
FIG. 8 schematically shows the sectional structure of the semiconductor device according to embodiment 3 of the present invention.

FIG. 8 schematically shows a sectional structure of the semiconductor device according to embodiment 3 of the present invention. The semiconductor device shown in FIG. 8 is different in structure from the semiconductor device shown in FIG. 2 in the following points. On the surface of n type drift layer 3, a high-concentration p type region 40 and a low-concentration p type region (seventh semiconductor region) 42 adjacent to high-concentration p type region (sixth semiconductor region) 40 are provided between p type base layer 5 and n type buffer layer 2. An electrode (fifth electrode) 44 is provided in contact with high-concentration p type region 40. Electrode 44 is normally short-circuited with emitter electrode 12. P type impurity region 40 is formed to a depth shallower than that of p type base layer 5. High-concentration p type impurity region 40 is provided for ensuring the breakdown voltage of low-concentration p type impurity region 42.

In FIG. 8, the end portion of high-concentration p type region 40 is formed arriving at the end portion of gate electrode 13. However, it is not particularly required that the end portion of gate electrode 13 and the end portion of high-concentration p type region 40 should be aligned in a planar view.

An anode layer 55 and a cathode layer 50 each are a diffusion layer formed with an impurity doped into the surface of the n type drift layer. An n type drift layer 3 is a monocrystalline film epitaxially grown on the surface of the p type semiconductor substrate.

The other configuration of the semiconductor device shown in FIG. 8 is same as the configuration of the semiconductor device shown in FIG. 2, corresponding parts are allotted the same reference numerals, and detailed descriptions thereof will not be repeated. Furthermore, the thickness, t, of semiconductor substrate 10 just below collector region 1 is set to a thickness in a range of Ls or greater and 2×Ls or smaller, with respect to the distance Ls between p type base layer 5 and n type buffer layer 2 as in embodiments 1 and 2.

In the semiconductor device shown in FIG. 8, an electron current injected through a channel formed on channel forming region 8 on the surface of p type base layer 5 flows to n type buffer layer 2 through n type drift layer 3. Accordingly, a hole current flows from p type collector layer 1 to n type drift layer 3, the conductivity modulation occurs, the resistance value of n type drift layer 3 decreases, and a large electron current flows. At this time, p type impurity region 40 absorbs a part of hole current as in rear-side electrode 14 to inhibit the hole current from flowing to emitter layer 4 in large quantity, to further improve the latch-up immunity.

Furthermore, upon turn-off, similarly, impurity region 44 absorbs holes in n type drift layer 3 together with rear-side electrode 14, to further reduce the turn-off loss.

In the semiconductor device shown in FIG. 8, the depletion layer spreads as shown with the dotted line in FIG. 8, since collector layer 1 is positively biased with respect to n type drift layer 3 upon turn-off. In the depleting, low-concentration impurity region 42 is fully depleted (because the impurity concentration of p type region 42 is low). In this case, in n type drift layer 3, the junction interface exists between n type drift layer 3 and p type impurity regions 40 and 42 and between n type drift layer 3 and p type semiconductor substrate 10. This structure is generally known as a double RESURF structure. Drift layer 3 is depleted by the spread of the depletion layer from two junction interfaces in the depleting. Therefore, the RESURF condition for n type drift layer 3 becomes 2E12/cm^2, which is twice as large as the RESURF condition when the depletion layer spreads from one side (spreads upward from the substrate junction interface) as shown in FIG. 2. Therefore, the impurity concentration of n type drift layer 3 can be increased, and the resistance value can be reduced by a factor of about 2.

In this case also, the thickness, t, of p type semiconductor substrate 10 (thickness of a region just below the collector layer) satisfies the aforementioned condition of Ls≦t≦2×Ls, for the distance Ls between p type base layer 5 and n type buffer layer 2. Therefore, an effect similar to that of the semiconductor device shown in embodiment 1 is also achieved.

The thickness of n type drift layer 3 and the thickness of p type regions 40 and 42 are set to values which ensure that before two junction interfaces on and under the drift layer break down, depletion layers from these two junction interfaces spread completely throughout n drift layer 3.

[Modification 1]

Figure 9:
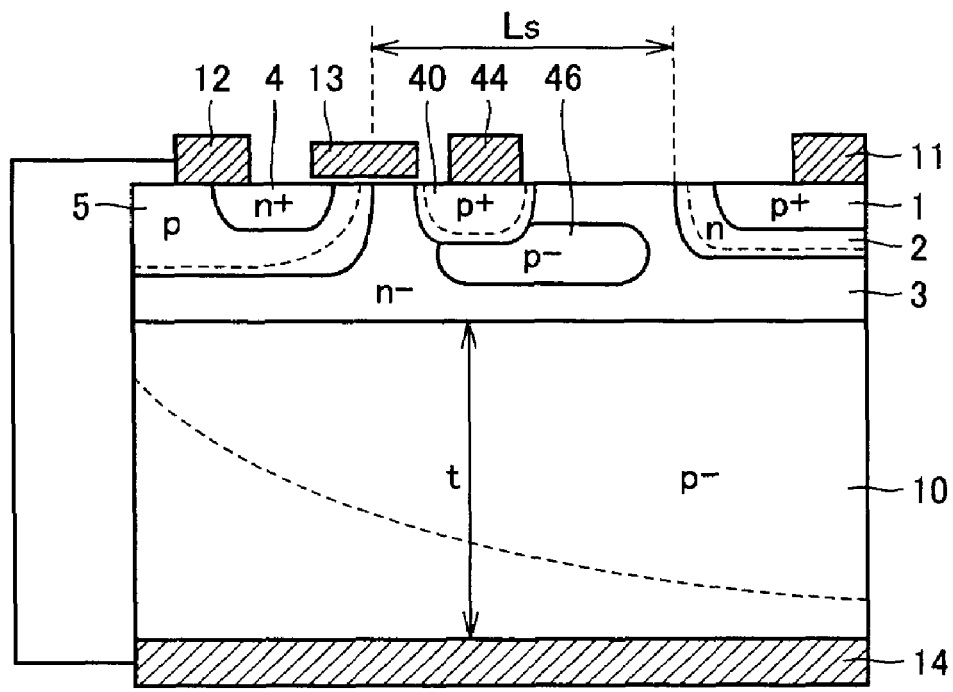
FIG. 9 schematically shows the sectional structure of the semiconductor device according to modified example 1 of embodiment 3 of the present invention.

FIG. 9 schematically shows the sectional structure of the semiconductor device of modification 1 of embodiment 3 of the present invention. The semiconductor device shown in FIG. 9 is different in structure from the semiconductor device shown in FIG. 8 in the following point. In the semiconductor device shown in FIG. 9, a low-concentration p type buried layer 46 is formed in the area under high-concentration p type region 40 in n type drift layer 3. Low-concentration p type region 42 shown in FIG. 8 is not provided. The other structure of the semiconductor device shown in FIG. 9 is same as the semiconductor device shown in FIG. 8, corresponding parts are allotted the same reference numerals, and detailed descriptions thereof will not be repeated.

In the semiconductor device shown in FIG. 9, upon turn-on, a hole current flows from high-concentration p type region 40 when an electron current flows through a channel region just below a gate, the conductivity modulation occurs between p type base layer 5 and high-concentration p type region 40, and the electron current increases. Subsequently, the junction interface in p type region 40 is biased in a forward direction, and the electron current from n type emitter layer 4 arrives at n type buffer layer 3 through p type region 40. Accordingly, holes flow from p type collector layer 1 into n type drift layer 3, the conductivity modulation of n type drift layer 3 pervades, the resistance value decreases, and a large electron current flows. Paths through which the electron current flows are formed on and under p type buried layer 46.

In turn-off, the holes in n type drift layer 3 are absorbed by p type region 40, and as in the structure shown in FIG. 8, the hole current is cut off rapidly and the turn-off loss can be reduced.

In the off-state, the depletion layer spreads as shown by the dotted line in FIG. 9, and n type drift layer 3 is fully depleted, and low-concentration p type region 46 is fully depleted. In n type drift layer 3, pn junction interfaces are formed between n type drift layer 3 and p type semiconductor substrate 10 and on and under the p type buried layer. Therefore, in n type drift layer 3, the depleting proceeds by the depletion layer from the junction interface between n type drift layer 3 and semiconductor substrate 10 in addition to the depletion layers spreading from junction interfaces on and under p type buried layer 46.

Therefore, if p type buried region 46 is used, there are three junction interfaces generating the vertical electrical field of the n type drift layer, and the RESULF condition is three-fold, i.e. 3E12/cm^2. Accordingly, the impurity concentration of n type drift layer 3 can be increased, the resistance value can be reduced by a factor of about 3, and a larger amount of on-current can be passed.

In the configuration shown in FIG. 9, the thickness, t, of p type semiconductor substrate 10 is set to a thickness in a range of Ls or greater and 2×Ls or smaller as in embodiments 1 to 3 for the relationship with the distance Ls between p type base layer 5 and n type buffer layer 2, as in embodiments 1 to 3. Thus, in addition to the effect of embodiment 1, the on-current can be increased and the turn-off loss can be further reduced.

Here, in the semiconductor device shown in FIGS. 8 and 9, a high-concentration p type region (preferably diffusion region) may be further provided in the area under p type semiconductor substrate 10 as shown in FIG. 7. In this case, the effect of embodiment 2 can also be achieved.

Meanwhile, high-concentration p type region 40 is provided for biasing low-concentration p type regions 42 and 46, and may be formed in a ring form between p type base layer 5 and n type buffer layer 2 and surrounding drift layer 2, or may be formed in an island form, in the planar layout as shown in FIG. 1. P type regions 42 and 46 are formed in a ring form and in contact with high-concentration p type region 40.

Formation of p type buried region 46 can be normally achieved by a manufacturing step similar to that for a buried collector electrode used in a bipolar transistor or the like.

In this connection, in FIGS. 8 and 9, a double RESURF structure and a triple RESURF structure are shown. However, a comparable effect can be obtained even with a semiconductor device having a multi-RESURF structure in which a larger number of junctions are formed in the drift layer.

As described above, according to embodiment 3 of the present invention, in the semiconductor device having a multi-RESURF structure, the substrate thickness is optimized, the breakdown voltage characteristic can be ensured, and a large on-current can be supplied.

Embodiment 4

Figure 10:
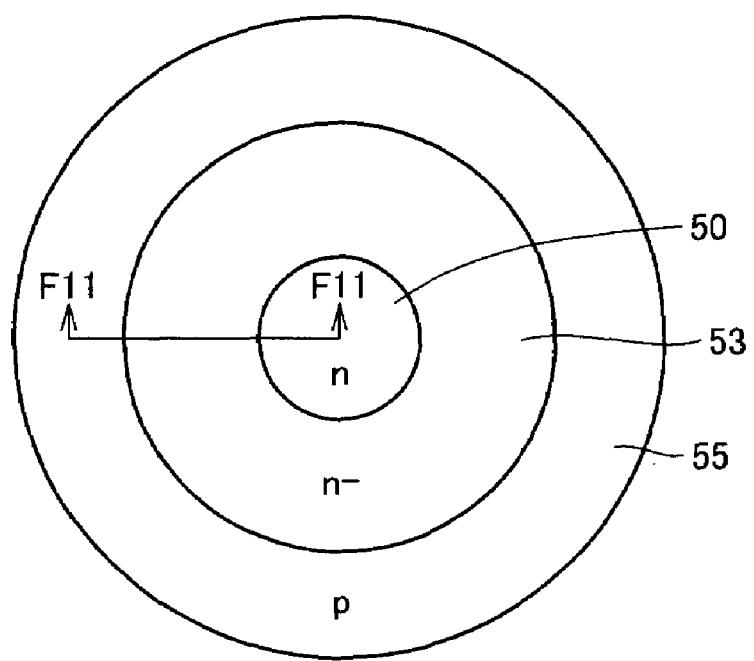
FIG. 10 schematically shows a planar layout of a semiconductor device according to embodiment 4 of the present invention.

FIG. 10 schematically shows a planar layout of the semiconductor device according to embodiment 4 of the present invention. In FIG. 10, the planar layout of an impurity diffusion region is shown, but neither the electrode nor the underlying substrate is shown.

In FIG. 10, the semiconductor device includes an n type cathode layer (first semiconductor region) 50 formed at the center, an n type drift layer (third semiconductor region) 53 formed surrounding n type cathode layer 50, and a p type anode layer (second semiconductor region) 55 formed surrounding n type cathode layer 50 and n type drift layer 53.

The semiconductor device shown in FIG. 10 is a lateral PN diode, and is normally used as a free wheel diode in the lateral IGBT and others.

N type drift layer 53 is formed extending to n type cathode layer 50 and the bottom of p type anode layer 55 as described later. It may be formed in a track form rather than a circular form in the planar layout of the lateral diode.

Figure 11:
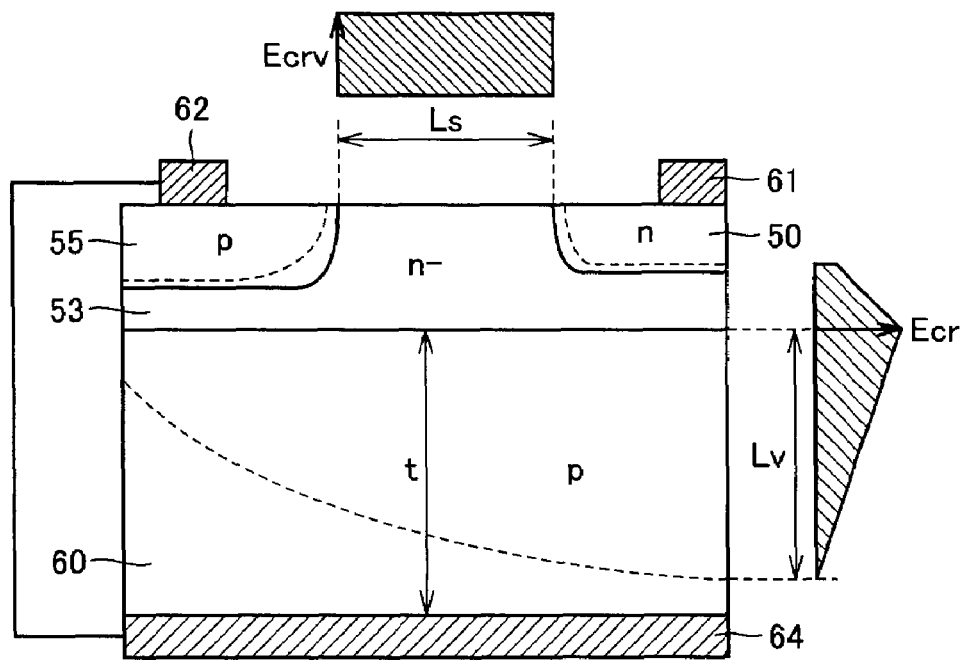
FIG. 11 schematically shows the sectional structure taken along line F11-F11 shown in FIG. 10.

FIG. 11 schematically shows a sectional structure taken along line F11-F11 shown in FIG. 10. In FIG. 11, n type cathode layer 50 and p type anode layer 55 are formed at an interval on the surface of n type drift layer 53. A p type semiconductor substrate 60 is provided under n type drift layer 53. The main surface of p type semiconductor substrate 60 contacts n type drift layer 53, and a pn junction is formed between substrate 60 and drift layer 53.

On n type cathode layer 50, a cathode electrode 61 is formed being electrically connected to the surface of cathode layer 50. An anode electrode 62 is formed in contact to the surface of p type anode layer 55. On the back surface (second main surface) of p type semiconductor substrate 60, a rear-side electrode 64 is formed in contact with the back surface of substrate 60. Normally, rear-side electrode 64 is short-circuited with anode electrode 62. The thickness, t, of p type semiconductor substrate is so set as to satisfy the following relationship with the distance Ls along the surface of drift layer 53 between p type anode layer 50 and n type cathode layer 50:

$$Ls \leq t \leq 2 \times Ls.$$

In the semiconductor device shown in FIG. 11, a high breakdown voltage is achieved by a RESURF technique. Upon turn-off, cathode layer 50 is positively biased. In this state, a backward voltage is applied to each pn junction to cause the depletion layer to spread into drift layer 53. In turn-on, cathode electrode 61 is negatively biased. In this case, holes are injected from rear-side electrode 64 into n type drift layer 53 through p type anode layer 55 and p type semiconductor substrate 60. The pn junction of n type cathode layer 50 is biased in a forward direction to turn conductive, and a hole current flows to cathode electrode 61. P type semiconductor substrate 60 has a low impurity concentration and has a relatively high resistance value, and therefore like the on-current of the lateral IGBT, a major part of the current flows between anode electrode 62 and cathode electrode 61.

Figure 12:
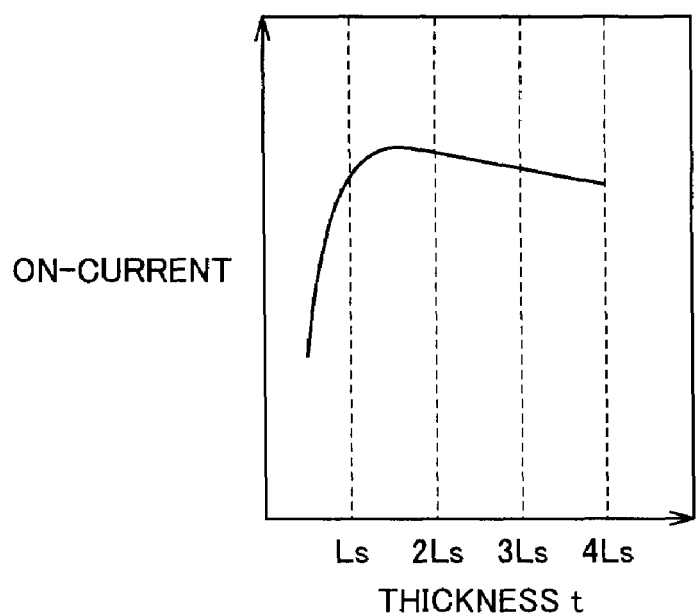
FIG. 12 shows the relationship between the thickness of the substrate and an on-current (forward bias current) in the semiconductor device according to embodiment 4 of the present invention.

FIG. 12 shows the relationship between the thickness, t, of substrate 60 and the on-current in the semiconductor device (lateral diode) shown in FIG. 11. With reference to FIG. 12, the relationship between the on-current and the substrate thickness in the semiconductor device (lateral diode) will be discussed.

Upon turn-on, cathode electrode 61 is negatively biased as described above. Accordingly, an electron current flows from n type cathode layer 50 toward p type anode layer 55. The electron barrier of p type anode layer 55 declines, the junction between p type anode layer 55 and n type drift layer 53 is biased in a forward direction, and holes are injected from p type anode layer 55 to n type drift layer 53. At this time, the junction between n type drift layer 53 and p type semiconductor substrate 60 is biased in a forward direction, and a hole current is injected from n type semiconductor substrate 60 into n type drift layer 53. As a result of the injection of the holes into n type drift layer, the conductivity modulation occurs by n type drift layer 53, the resistance of n type drift layer 53 decreases, and a large current flows from p type anode layer 55 to n type cathode layer 50.

Furthermore, by diode operation, holes are injected from p type semiconductor substrate 60 into n type drift layer 53. Current components of diode operation (electron and hole current components) flowing from cathode electrode 61 toward rear-side electrode 64 are distributed throughout the junction between p type semiconductor substrate 60 and n type drift layer 53. Therefore, the on-current in the vertical direction is larger than the on-current by bipolar transistor operation in the vertical direction in the lateral IGBT. When the thickness, t, of p type semiconductor substrate 60 increases, an area influenced by the conductivity modulation extends along the direction of the thickness (vertical direction) of p type semiconductor substrate 60. However, the degree in which current components of diode operation for rear-side electrode 64 decreases with an increase in thickness t is higher, compared to the lateral IGBT (because it is not a bipolar operation), and the decrease in on-current becomes greater with an increase in thickness as shown in FIG. 12.

On the other hand, when p type semiconductor substrate 60 is thin, the resistance value of p type semiconductor substrate 60 decreases, the electron current component flowing to rear-side electrode 64 becomes too large, the conductivity modulation by injection of the holes into n type drift layer 53 is hindered, and the on-current abruptly decreases.

Figure 13:
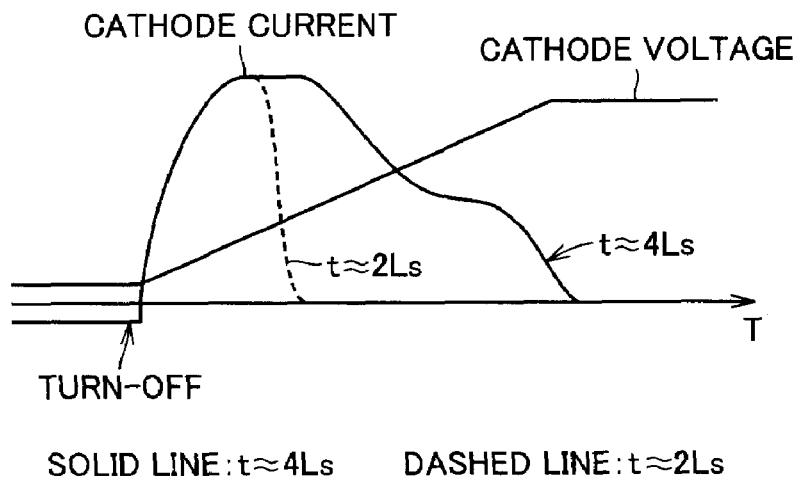
FIG. 13 shows the relationship between a reverse recovery characteristic upon turn-off and the thickness of the substrate in the semiconductor device according to embodiment 4 of the present invention.

FIG. 13 shows cathode current and cathode voltage waveforms upon turn-off for the lateral diode according to embodiment 4 of the present invention. FIG. 13 shows simulation waveforms where a resistor is connected in series to cathode electrode 61 and the cathode voltage is changed from −2 V to +100 V in a cycle of 5 μs. In FIG. 13, the solid line of the cathode current represents a cathode current waveform when the thickness, t, of p type semiconductor substrate 60 is approximately 4×Ls, and the dashed line represents a cathode waveform when the thickness t is 2×Ls. The cathode voltage waveform where the thickness t is Ls is almost the same as the waveform where the thickness t is 2×Ls.

As shown in FIG. 13, the voltage level of the cathode voltage increases (set to a positive bias state) upon turn-off of the lateral diode. At this time, a backward current flows and the cathode current increases. In a reverse recovery process, the holes from n type cathode layer 50 return to anode electrode 62 and rear-side electrode 64. Specifically, the backward current in the reverse recovery process is a hole current in which the holes accumulated in n type drift layer 53 flows to p type anode layer 55 and rear-side electrode 64. In the lateral IGBT, injection of the holes from the collector electrode after turn-off is inhibited by the n type buffer layer. In the lateral diode, the n type buffer layer is absent, so that injection of the holes by the buffer layer does not occur.

Therefore, for (the lateral diode of) the semiconductor device in embodiment 4, an effect of improvement similar to that of the lateral IGBT of embodiment 1 can be achieved. That is, when the thickness t is 2×Ls, the holes are ejected at a high speed and the cathode current is rapidly cut off. On the other hand, when the thickness t is 4×Ls, the speed of ejection of the holes in substrate 60 is slow, and the cathode current gently decreases. As apparent from FIG. 13, time required for the cathode current to be cut off upon turn-off, namely reverse recovery time, can be shortened by reducing the thickness, t. In other words, a loss in the reverse recovery process can considerably be reduced.

Furthermore, when the thickness t satisfies the requirement of $Ls \leq t \leq 2 \times Ls$, a region with the largest on-current is included as shown in FIG. 12, and thus a large current can be driven upon turn-off This makes it possible to achieve a lateral diode having a reduced loss upon turn-off and an excellent breakdown voltage characteristic and capable of driving a large current.

In the configuration of the semiconductor device shown in FIG. 11, a high-concentration p type semiconductor substrate may be provided between p type semiconductor substrate 60 and rear-side electrode 64 as in embodiment 2. In this case, p type substrate 60 is electrically coupled to rear-side electrode 64 through a low-resistance substrate (diffusion layer), and therefore in the lateral diode, a loss upon turn-off can be further reduced, and an effect similar to that of embodiment 2 can be achieved.

Here, FIG. 11 shows a surface electric field distribution and a vertical electrical field distribution in each depletion layer, but the field distribution is the same as the field distribution shown in embodiment 1, and the relationship between the thickness, t, of p type semiconductor substrate 60 and the distance, Ls, can be determined in the same manner.

Furthermore, in this diode, the conductivity types of the regions may be set reversely, or n type and p type are exchanged.

Embodiment 5

Figure 14:
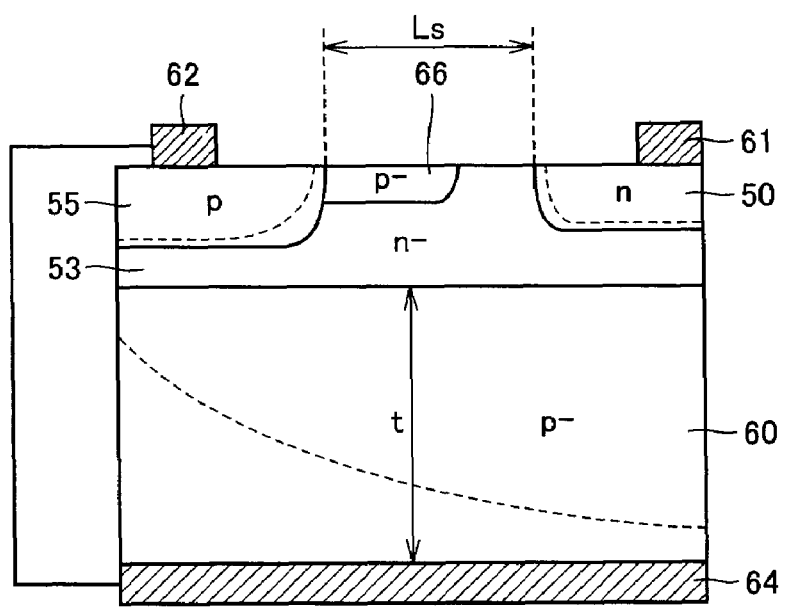
FIG. 14 schematically shows the sectional structure of the semiconductor device according to embodiment 5 of the present invention.

FIG. 14 schematically shows a sectional structure of the semiconductor device according to embodiment 5 of the present invention. The semiconductor device shown in FIG. 14 is different in structure from the semiconductor device shown in FIG. 11 in the following point. On the surface of n type drift layer 53, a low-concentration p type region 66 is formed in contact with p type anode layer 55. The other configuration of the semiconductor device shown in FIG. 14 is same as the configuration of the semiconductor device shown in FIG. 11, corresponding parts are allotted the same reference numerals, and detailed descriptions thereof will not be repeated.

The semiconductor device shown in FIG. 14 has a double RESURF structure as in the semiconductor device according to embodiment 3 shown in FIG. 8. In n type drift layer 53, the depletion layers spread from upper and lower pn junctions upon turn-off. Therefore, as in the semiconductor device shown in FIG. 8, the impurity concentration of n type drift layer 53 under the RESURF condition can be increased (2×E12/cm^2), and the resistance of n type drift layer 53 can be reduced. Thus, the on-current in a forward bias operation can be increased, compared to the semiconductor device (lateral diode) shown in FIG. 11.

Meanwhile, in the configuration of the semiconductor device shown in FIG. 14, a high-concentration p type semiconductor substrate (diffusion layer) may be provided between rear-side electrode 64 and p type semiconductor substrate 60, and p type semiconductor substrate 60 may be electrically coupled to the rear-side electrode through a low-resistance substrate (semiconductor layer, or diffusion layer). The turn-off loss can further be reduced in such configuration.

[Modification 1]

Figure 15:
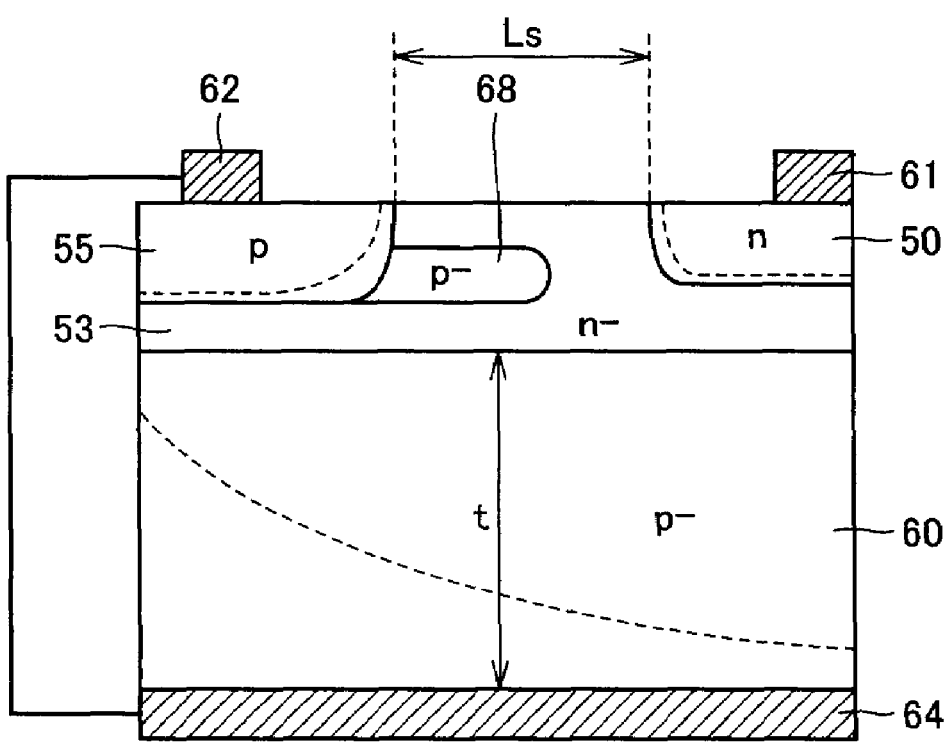
FIG. 15 schematically shows the sectional structure of a modification of the semiconductor device according to embodiment 5 of the present invention.

FIG. 15 schematically shows the sectional structure of modification 1 of the semiconductor device according to embodiment 5 of the present invention. In the semiconductor device shown in FIG. 15, a low-concentration p type buried layer 68 is further formed in contact with p type anode layer 55 in drift layer 53 in the structure of the semiconductor device shown in FIG. 11. The other configuration of the semiconductor device shown in FIG. 15 is same as the configuration of the semiconductor device shown in FIG. 11, corresponding parts are allotted the same reference numerals, and detailed descriptions thereof will not be repeated.

The effect of low-concentration p type buried layer 68 in the semiconductor device shown in FIG. 15 is same as the effect of low-concentration p type buried layer 46 of the semiconductor device shown in FIG. 9. Therefore, in the case of the semiconductor device shown in FIG. 15, in addition to the depletion layer from the junction interface between n type drift layer 53 and p type semiconductor substrate 60, the depletion layers spread from upper and lower junctions between p type buried layer 68 and n type drift layer 60, in n type drift layer 53, in turn-off. Thus, the impurity concentration of n type drift layer 53 can be further increased (3E12/cm^2), and the resistance value of n type drift layer 53 can be further reduced. Accordingly, the current (on-current) flowing through the semiconductor device in a forward bias operation can be further increased.

Furthermore, in the semiconductor device shown in FIG. 15, a high-concentration p type semiconductor substrate (diffusion layer) may be provided between p type semiconductor substrate 60 and rear-side electrode 64.

Meanwhile, p type layers 66 and 68 shown in FIGS. 14 and 15, respectively, are formed, along p type anode layer 55, surrounding cathode layer 50.

Here, in embodiments 1 to 5, a similar effect can be achieved by satisfying the condition for the thickness of the substrate region even if the conductivity types are reversed.

Generally, the present invention, when applied to a lateral IGBT or a lateral diode, can achieve a high breakdown voltage semiconductor device capable of reducing a turn-off loss and driving a large current while maintaining a breakdown voltage. The semiconductor device may be used in an intelligent power module or may be used alone.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate of a first conductivity type;
   a first semiconductor region of the first conductivity type formed above a first main surface of said first semiconductor substrate;
   a second semiconductor region of the first conductivity type formed at a distance from said first semiconductor region above the first main surface of said first semiconductor substrate;
   a third semiconductor region of a second conductivity type formed at least on a region between said first semiconductor region and said second semiconductor region above the first main surface side of said first semiconductor substrate;
   a fourth semiconductor region of a second conductivity type formed in said second semiconductor region and on the surface of said second semiconductor region;
   a fifth semiconductor region of the second conductivity type formed in contact with said first semiconductor substrate, to a depth deeper than depths of the first, second and third semiconductor regions and surrounding the second and third semiconductor regions and being formed in contact with at least a part of said second semiconductor region and encompassing said second semiconductor region;
   a first electrode electrically connected to said first semiconductor region;
   a second electrode electrically connected to the second and fourth semiconductor regions;
   a conductive layer formed on said second semiconductor region between said fourth semiconductor region and said fifth semiconductor region with an insulating film interposed between the second semiconductor region and the conductive layer; and
   a fourth electrode electrically coupled to said first semiconductor substrate,
   a distance, t, from a junction interface between said fifth semiconductor region just below said third semiconductor region and said first semiconductor substrate to a second main surface of said first semiconductor substrate and a distance, L, between the second and third semiconductor regions satisfying a relation of L≦t≦2×L.

2. The semiconductor device according to claim 1, further comprising a second semiconductor substrate formed between said first semiconductor substrate and said fourth electrode and having a resistance lower than a resistance of said first semiconductor substrate.

3. The semiconductor device according to claim 1, wherein said third semiconductor region is formed to a depth deeper than a depth of said first semiconductor region and surrounding said first semiconductor region.

4. The semiconductor device according to claim 1, wherein said fifth semiconductor region is formed surrounding the first to third semiconductor regions.

5. The semiconductor device according to claim 1, further comprising:
a sixth semiconductor region of the first conductivity type formed between the second and third semiconductor regions and at a distance from the second and third semiconductor regions on the surface of said fifth semiconductor region; and
a fifth electrode electrically connected to said sixth semiconductor region.

6. The semiconductor device according to claim 5, further comprising a seventh semiconductor region formed in contact with said sixth semiconductor region and between the second and third semiconductor regions and having a resistance higher than a resistance of said sixth semiconductor region.

* * * * *